(12) United States Patent
Sato et al.

(10) Patent No.: US 10,532,442 B2
(45) Date of Patent: Jan. 14, 2020

(54) POLISHING APPARATUS AND WAFER POLISHING METHOD

(71) Applicants: SHIN-ETSU HANDOTAI CO., LTD., Tokyo (JP); FUJIKOSHI MACHINERY CORP., Nagano-shi, Nagano (JP)

(72) Inventors: Michito Sato, Nishigo-mura (JP); Junichi Ueno, Shirakawa (JP); Kaoru Ishii, Shirakawa (JP); Hiromi Kishida, Chikuma (JP); Yuya Nakanishi, Nagano (JP); Ryosuke Yoda, Nagano (JP); Yosuke Kanai, Nagano (JP)

(73) Assignees: SHIN-ETSU HANDOTAI CO., LTD., Tokyo (JP); FUJIKOSHI MACHINERY CORP., Nagano (JP)

( * ) Notice: Subject to any disclaimer, the term of this patent is extended or adjusted under 35 U.S.C. 154(b) by 213 days.

(21) Appl. No.: 15/512,957

(22) PCT Filed: Sep. 25, 2015

(86) PCT No.: PCT/JP2015/004874
§ 371 (c)(1),
(2) Date: Mar. 21, 2017

(87) PCT Pub. No.: WO2016/063457
PCT Pub. Date: Apr. 28, 2016

(65) Prior Publication Data
US 2017/0304992 A1    Oct. 26, 2017

(30) Foreign Application Priority Data

Oct. 21, 2014  (JP) ................................ 2014-214798

(51) Int. Cl.
*B24B 37/34* (2012.01)
*B24B 27/00* (2006.01)
(Continued)

(52) U.S. Cl.
CPC ............ *B24B 37/345* (2013.01); *B24B 25/00* (2013.01); *B24B 27/0023* (2013.01);
(Continued)

(58) Field of Classification Search
CPC ..... B24B 37/345; B24B 37/04; B24B 53/017; B24B 37/042; B24B 25/00; B24B 27/0023; B24B 27/0076
See application file for complete search history.

(56) References Cited

U.S. PATENT DOCUMENTS

2001/0012751 A1*  8/2001  Boyd .................... B24B 37/042
                                                              451/41
2005/0032467 A1*  2/2005  Hoshino ............... B24B 53/017
                                                              451/56
(Continued)

FOREIGN PATENT DOCUMENTS

CN      102858495 A      1/2013
CN      103909466 A      7/2014
(Continued)

OTHER PUBLICATIONS

Jun. 26, 2017 Office Action and Search Report issued in Taiwanese Patent Application No. 104134405.
(Continued)

*Primary Examiner* — Timothy V Eley
(74) *Attorney, Agent, or Firm* — Oliff PLC

(57) ABSTRACT

A polishing apparatus which is an index system polishing apparatus which includes a polishing head for holding a wafer, a plurality of turn tables to which polishing pads for polishing the wafer are attached, and a loading/unloading stage for loading the wafer to the polishing head or unloading the wafer from the polishing head, and which polishes the wafer while switching the turn tables to be used for polishing the wafer held at the polishing head by causing the
(Continued)

polishing head to perform rotation movement, the polishing apparatus including a turn table upward and downward movement mechanism which allows the turn table to move upward and downward. With this polishing apparatus, it is possible to reduce an amount of displacement caused when moment load is applied on the polishing head during polishing.

8 Claims, 11 Drawing Sheets

(51) Int. Cl.
    *B24B 25/00*     (2006.01)
    *B24B 37/04*     (2012.01)
    *B24B 53/017*    (2012.01)
    *H01L 21/304*   (2006.01)

(52) U.S. Cl.
    CPC .......... *B24B 27/0076* (2013.01); *B24B 37/04* (2013.01); *B24B 37/042* (2013.01); *B24B 53/017* (2013.01); *H01L 21/304* (2013.01)

(56) References Cited

U.S. PATENT DOCUMENTS

| | | | | |
|---|---|---|---|---|
| 2009/0137190 A1* | 5/2009 | Togawa | ............... | B24B 37/013 451/8 |
| 2011/0104997 A1* | 5/2011 | Jeong | ..................... | B24B 37/10 451/65 |
| 2011/0256812 A1* | 10/2011 | Dhandapani | .......... | B24B 37/042 451/56 |
| 2012/0315829 A1 | 12/2012 | Tanikawa et al. | | |

FOREIGN PATENT DOCUMENTS

| | | |
|---|---|---|
| JP | H09-290363 A | 11/1997 |
| JP | 2012-254490 A | 12/2012 |
| JP | 2013-525126 A | 6/2013 |
| JP | 2014-039985 A | 3/2014 |
| WO | 2011/133386 A2 | 10/2011 |

OTHER PUBLICATIONS

Dec. 28, 2015 International Search Report issued in International Patent Application No. PCT/JP2015/004874.
Nov. 22, 2016 Office Action issued in Japanese Patent Application No. 2014-214798.
Apr. 25, 2017 International Preliminary Report on Patentability issued in International Patent Application No. PCT/JP2015/004874.
Jul. 19, 2018 Office Action issued in Chinese Patent Application No. 201580057515.8.

\* cited by examiner

DISPLACEMENT AMOUNT

POLISHING APPARATUS AND WAFER POLISHING METHOD

TECHNICAL FIELD

The present invention relates to an index system polishing apparatus and a wafer polishing method.

BACKGROUND ART

A semiconductor wafer (hereinafter, also simply referred to as a wafer) typified by a silicon wafer is polished using a method for polishing the both sides at the same time or a method for polishing one side.

In order to polish one side of the wafer, as illustrated in FIG. 11, a polishing apparatus 101 configured with a turn table 104 to which a polishing pad 103 is attached, a polishing agent supplying mechanism 108 for supplying a polishing agent 107 on the turn table 104, and a polishing head 102 for holding a wafer W to be polished, is widely used.

The polishing apparatus 101 holds the wafer W with the polishing head 102 and performs polishing by supplying the polishing agent 107 on the polishing pad 103 from the polishing agent supplying mechanism 108, while respectively rotating the turn table 104 and the polishing head 102 to bring a surface of the wafer W into sliding contact with the polishing pad 103.

Further, the wafer is often polished through multiple stages while a type of the polishing pad and a type of the polishing agent being changed, and a polishing apparatus having two turn tables or three turn tables, which is called an index system, is widely used.

Here, FIG. 12 illustrates an example of a polishing apparatus 201 having first to third turn tables 204a to 204c. In the polishing apparatus 201, in which polishing heads 202a to 202d are attached to first to fourth polishing shafts 209a to 209d, two polishing heads can be assigned to one turn table. Therefore, it is possible to polish two wafers per one batch, so that the polishing apparatus 201 particularly excels in productivity.

There is a case where such a polishing apparatus 201 has a dressing mechanism for performing brushing and dressing to suppress clogging of the polishing pad.

While it is possible to suppress clogging of the polishing pad through brushing and dressing, because the wafer cannot be polished during brushing and dressing, productivity degrades. Therefore, a frequency and a period of brushing and dressing are set as appropriate according to a type of the polishing pad to be used and polishing machining allowance to suppress degradation of productivity.

Specific flow of polishing using the index system polishing apparatus 201 will be described using an example of a polishing head 202a of the first polishing shaft 209a based on a flowchart in FIG. 13.

First, a wafer is loaded on the polishing head 202a (SP101). When the wafer is loaded, the polishing head 202a moves downward to hold the wafer on a loading/unloading stage 212 as illustrated in FIG. 12. Note that, while a method for holding a wafer differs according to the polishing head to be used, typically, a vacuum contact method or a water paste method using a template is used.

After the polishing head 202a holding the wafer moves upward to a position where rotation can be performed, the polishing head 202a rotates by 90 degrees (SP102) and moves to the first turn table 204a (SP103).

Here, the position where rotation can be performed is, for example, a position where the polishing head 202a does not contact other members such as a dressing mechanism when the polishing head 202a rotates.

The polishing head 202a then moves downward to a position where the polishing head 202a contacts a polishing pad of the first turn table 204a, and polishing by the first turn table 204a to which the polishing pad is attached is started.

After polishing at the first turn table 204a is finished, the polishing head 202a moves upward again to the position where rotation can be performed and rotates by 90 degrees (SP104) and moves to the second turn table 204b (SP105). Then, polishing is started again.

After polishing at the third turn table 204c is performed while such operation is repeated (SP106 to SP107), the polishing head 202a moves upward again to the position where rotation can be performed, reversely rotates by 270 degrees (SP108), returns to the loading/unloading stage 212, where the wafer is unloaded (SP109), and one cycle is finished.

As described above, in a conventional index system polishing apparatus, the polishing head is moved upward and downward when polishing is started and finished, and when a turn table to be used for polishing is switched.

When the wafer is loaded/unloaded at the polishing head 202a attached to the first polishing shaft 209a, at the polishing heads 202b to 202d respectively attached to the second to the fourth polishing shafts 209b to 209d, polishing at the first to the third turn tables 204a to 204c are performed in parallel. In this manner, there is less standby time in the index system polishing apparatus, so that it is possible to perform polishing which excels in productivity.

Here, FIG. 14A and FIG. 14B illustrate side views of the conventional polishing apparatus. Further, FIG. 15A and FIG. 15B illustrate positional relationship between the two polishing heads and the dressing mechanism.

As illustrated in FIG. 14A, when the wafer W is polished, the polishing head 202 is moved downward to a lowermost position of upward and downward movement so that the wafer W contacts the polishing pad 203.

As illustrated in FIG. 15A, when the polishing head 202 is located at the lowermost position of the upward and downward movement, the polishing head 202 and the dressing mechanism 206 are located in the same height range. Therefore, if the polishing head 202 performs rotation operation without changing the height position of the polishing head 202, the polishing head 202 collides with the dressing mechanism 206.

Further, as illustrated in FIG. 14B, when the polishing head 202 moves upward to an uppermost position of the upward and downward movement, rotation operation of the polishing head 202 and dressing of the polishing pad 203 are performed. At this time, as illustrated in FIG. 15B, in the case where the polishing head 202 is located at the uppermost position of the upward and downward movement, the polishing head 202 is located at a height position where the polishing head 202 does not contact the dressing mechanism 206.

A stroke width of the upward and downward movement of the polishing head 202 is, for example, approximately, 120 mm. Further, as a mechanism for moving the polishing head upward and downward, typically, an air cylinder, or a drive system using a ball screw is employed.

Further, the dressing mechanism 206 is immersed in a storage water tank (not illustrated) during polishing to prevent drying of a brush and a dress. Therefore, a mechanism for moving upward and downward is also provided at the dressing mechanism 206. Further, a dressing mechanism 206 can also have a mechanism for rotating the brush or the dress, and can be used in conjunction with a high-pressure jet cleaning mechanism.

Therefore, it is difficult to reduce the thickness of the dressing mechanism, and, for example, in the case of a typical polishing apparatus for wafer having a diameter of 300 mm, a stroke width of 120 mm or greater is required for upward and downward movement of the polishing head to avoid collision with the dressing mechanism, and a length of the polishing shaft is required to be longer than this stroke width.

In the case where a polishing shaft having such a length is used, if moment load is applied on the polishing shaft while the wafer is polished, displacement of several μm occurs. In the case where such displacement occurs at the polishing shaft, there is a problem that fluctuation becomes large at an edge portion of the wafer to be polished, which adversely affects quality of the wafer. Particularly, in order to respond to a quality request of a design rule of 20 nm or less, quality of the wafer edge portion is important, and a polishing apparatus with high accuracy with improved stiffness of the polishing shaft is desired.

However, in the case where stiffness of a rotating portion is increased to suppress a displacement amount of the polishing shaft, weight of an upper part of the polishing apparatus becomes heavy. If the weight of the upper part of the polishing apparatus becomes heavy, because, as a result, a total weight of the apparatus considerably increases, which causes constraints to an area where the apparatus is provided, it is difficult to improve accuracy.

Further, when the polishing head performs rotation operation, in order to avoid physical interference between the polishing head and the dressing mechanism, the polishing head cannot perform rotation operation until the polishing head completely moves upward. Therefore, if the stroke width of the upward and downward movement is long, there is a problem that it takes long time for the polishing head to completely move upward, which results in long takt time and degrades productivity.

Further, when brushing and dressing are performed, in order to obtain a certain effect, it is necessary to manually adjust height of the dressing mechanism in accordance with life (abrasion) of the polishing pad, the brush and the dress. However, because it is necessary to stop the polishing apparatus to manually adjust the height of the dressing mechanism, the adjustment causes degradation of productivity.

Note that, while it is possible to suppress degradation of productivity due to stop of the polishing apparatus in accordance with adjustment of the height by providing a mechanism for automatically adjusting the height of the dressing mechanism, in this case, a structure of the dressing mechanism becomes complicated, and the height of the dressing mechanism increases. This causes a problem that productivity degrades more because the height position to which the polishing head should move upward becomes higher, and takt time thereby increases.

While Patent Literature 1 discloses a polishing apparatus which includes a turn table upward and downward movement mechanism so that a pressure applied on a polishing pad can be controlled by changing the height of the polishing pad, this polishing apparatus has a structure in which the turn table is provided at an upper part of the apparatus, and a wafer fixed on a sample stage located at a lower part is polished. Because, in this apparatus, the turn table and the turn table upward and downward movement mechanism which are heavy goods are located at the upper part of the apparatus, it is difficult to improve stiffness of the apparatus. Further, because this apparatus is not an index system apparatus, it is difficult to perform continuous polishing, and thus productivity is not high. Still further, there is no disclosure regarding brushing and dressing of the polishing pad which affect takt time.

CITATION LIST

Patent Literature

[Patent Literature 1] Japanese Unexamined Patent publication (Kokai) No. H09-290363

SUMMARY OF INVENTION

Technical Problem

The present invention has been made in view of the problems, and an object of the present invention is to provide a polishing apparatus which can reduce an amount of displacement of a polishing shaft caused when moment load is applied during polishing.

Solution to Problem

To achieve the object, the present invention provides an index system polishing apparatus which includes a polishing head for holding a wafer, a plurality of turn tables to which polishing pads for polishing the wafer are attached, and a loading/unloading stage for loading the wafer on the polishing head or unloading the wafer from the polishing head, and which polishes the wafer while switching the turn tables to be used for polishing the wafer held at the polishing head, the polishing apparatus has a turn table upward and downward movement mechanism which can move the turn tables upward and downward.

With such a polishing apparatus, because it is not necessary to move the polishing head upward and downward with a long stroke width, it is possible to shorten the length of a polishing shaft. By this means, stiffness of the polishing shaft is increased, so that it is possible to reduce an amount of displacement of the polishing shaft caused when moment load is applied during polishing. By this means, it is possible to polish the wafer with high accuracy.

At this time, the polishing apparatus preferably has a dressing mechanism at a position where the dressing mechanism does not interfere with a trajectory on which the polishing head performs rotation movement.

With such a configuration, it is possible to perform rotation movement of the polishing head and upward and downward movement of the turn tables in parallel without the polishing head interfering with the dressing mechanism. It is therefore possible to reduce takt time and improve productivity.

Further, at this time, the polishing apparatus preferably has a polishing head upward and downward movement mechanism for moving the polishing head upward and downward with a stroke width of 20 mm or less.

With the polishing head upward and downward mechanism, it is possible to support various kinds of polishing heads and support a polishing pad without a groove, and reliably suppress degradation of stiffness of the polishing shaft by suppressing an upward and downward movement width to 20 mm or less, so that it is possible to more reliably reduce an amount of displacement of the polishing shaft when moment load is applied during polishing.

Further, at this time, the rotation movement of the polishing head and the upward and downward movement of the turn tables and the polishing head can be preferably performed in parallel.

With such a configuration, it is possible to further reduce takt time.

Further, at this time, the turn table upward and downward movement mechanism preferably adjusts height of the turn table according to abrasion of the polishing pad when dressing of the polishing pad is performed by the dressing mechanism.

With such a configuration, it is possible to suppress variability of a dressing effect due to abrasion of the polishing pad, and it is possible to improve productivity because adjustment of the height of the dressing mechanism which requires time, is no longer required.

Further, the present invention provides a wafer polishing method using the polishing apparatus as described above, in which the turn table to be used for polishing the wafer held at the polishing head is switched by causing the turn table to move downward and causing the polishing head to perform rotation movement.

With such a polishing method, because it is not necessary to move the polishing head upward and downward with a long stroke width, it is possible to use the polishing shaft whose length is shortened and whose stiffness is improved, so that it is possible to reduce an amount of displacement of the polishing shaft caused when moment load is applied during polishing. By this means, it is possible to polish the wafer with high accuracy.

At this time, the method preferably includes a step of adjusting the height of the turn table according to abrasion of the polishing pad and dressing the polishing pad after polishing of the wafer is finished.

With such a configuration, it is possible to suppress variability of a dressing effect due to abrasion of the polishing pad, and it is possible to improve productivity because adjustment of the height of the dressing mechanism which requires time, is no longer required.

Advantageous Effects of Invention

According to the polishing apparatus, and the polishing method using the polishing apparatus of the present invention, because the turn table upward and downward movement mechanism can move the turn table upward and downward, it is not necessary to move the polishing head upward and downward with a long stroke width, so that it is possible to shorten the length of the polishing shaft. Therefore, because stiffness of the polishing shaft is improved, it is possible to reduce an amount of displacement of the polishing shaft caused when moment load is applied during polishing. By this means, it is possible to polish the wafer with high accuracy. Further, by revolution of the polishing head and the upward and downward movement of the turn table being performed in parallel, it is possible to shorten takt time and improve productivity. Further, with the turn table upward and downward movement mechanism, it is possible to maintain a dressing effect.

DESCRIPTION OF EMBODIMENT

Hereinafter, the embodiments of the present invention will be described, but the present invention is not limited to this embodiment.

As described above, there is a problem that, in the case where moment load is applied on a polishing shaft while a wafer is polished, displacement occurs at the polishing shaft, which adversely affects quality of the wafer being polished.

Therefore, the present inventors specifically investigated to solve such a problem. As a result, the present inventors conceived of providing a turn table upward and downward movement mechanism at the polishing apparatus. By allowing the turn table to move upward and downward with the turn table upward and downward movement mechanism, it is possible to shorten the length of the polishing shaft. By this means, stiffness of the polishing shaft is increased, so that it is possible to reduce an amount of displacement of the polishing shaft caused when moment load is applied during polishing.

The present inventors examined the best mode for carrying out these and completed the present invention.

First, the polishing apparatus of the present invention will be described with reference to FIG. 1A, FIG. 1B and FIG. 5.

Figure 3B:
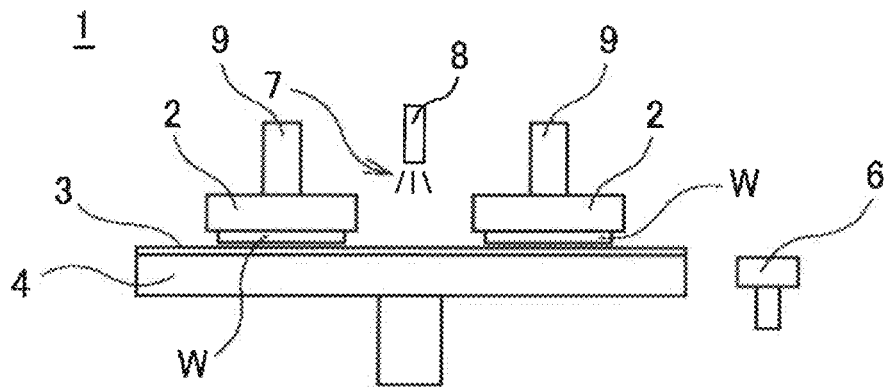
FIG. 3B is a schematic side view when the wafer is polished in a state where the turn table is moved upward with the turn table upward and downward movement mechanism in an example of the polishing apparatus of the present invention.
Figure 4B:
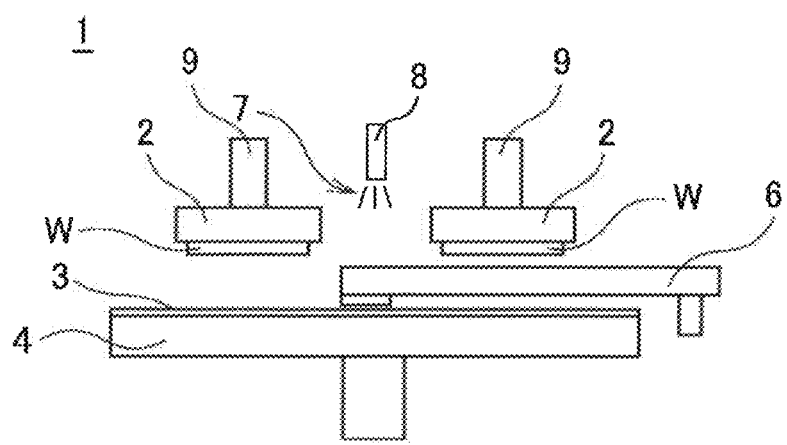
FIG. 4B is a schematic side view when the polishing pad is dressed in a state where the turn table is moved downward with the turn table upward and downward movement mechanism in an example of the polishing apparatus of the present invention.
Figure 5:
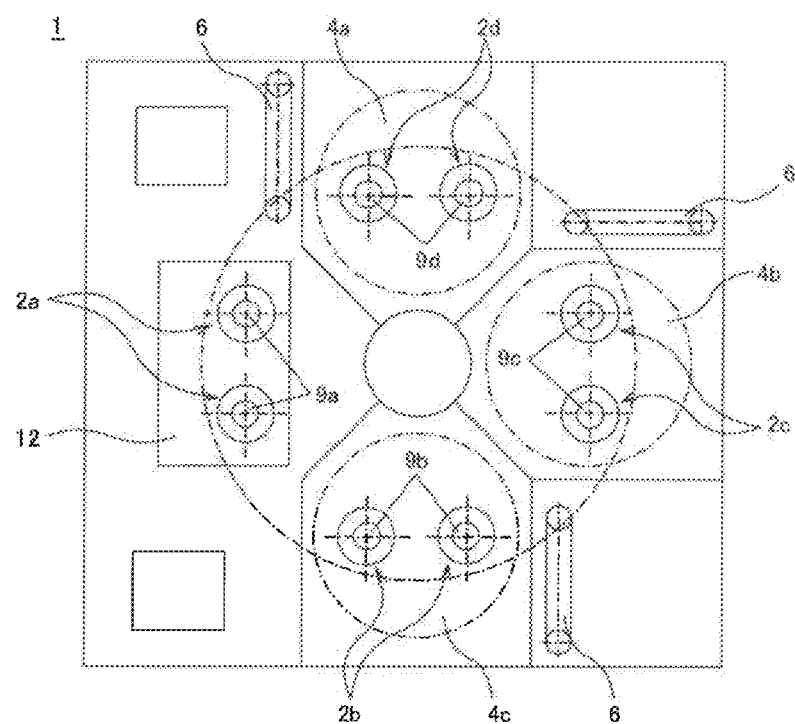
FIG. 5 is a schematic top view illustrating an example of the polishing apparatus of the present invention.

As illustrated in FIG. 5, the polishing apparatus 1 of the present invention includes polishing heads 2a to 2d for holding wafers, a plurality of turn tables 4a to 4c and a loading/unloading stage 12. Further, as illustrated in FIG. 1A and FIG. 1B, the polishing apparatus 1 includes a turn table upward and downward movement mechanism 5 which can move the turn tables 4a to 4c upward and downward. A polishing pad 3 for polishing the wafer W is attached to each of the turn tables 4a to 4c. The wafers W can be loaded on the polishing heads 2a to 2d or unloaded from the polishing heads 2a to 2d on the loading/unloading stage 12. Above the turn tables 4a to 4c, a polishing agent supplying mechanism 8 for supplying a polishing agent 7 on the turn tables 4a to 4c when the wafers W are polished is provided (see FIG. 3B and FIG. 4B).

As illustrated in FIG. 5, the polishing apparatus 1 has a first polishing shaft 9a for attaching and rotating the polishing head 2a for holding the wafer W above the loading/unloading stage 12. In a similar manner, the polishing head 2d and the fourth polishing shaft 9d are provided above the first turn table 4a, the polishing head 2c and the third polishing shaft 9c are provided above the second turn table 4b, and the polishing head 2b and the second polishing shaft 9b are provided above the third turn table 4c.

By respective polishing shafts 9a to 9d rotating at the same time, respective polishing heads 2a to 2d perform rotation movement, and polishing is performed while turn tables 4a to 4c to be used for polishing the wafer W are switched. Positions of the respective polishing heads 2a to 2d and polishing shafts 9a to 9d illustrated in FIG. 5 are initial positions, and, thereafter, the wafer W is polished, loaded and unloaded while the turn tables to be used for polishing are switched by rotation movement being repeated.

Here, to simplify the explanation, two polishing heads are indicated with reference numerals 2a to 2d, and two polishing shafts are indicated with reference numerals 9a to 9d. That is, two polishing heads are assigned to one turn table.

As a method for holding the wafer W with the polishing heads 2a to 2d, it is possible to use a vacuum contact method or a water filling method using a template.

Figure 2:
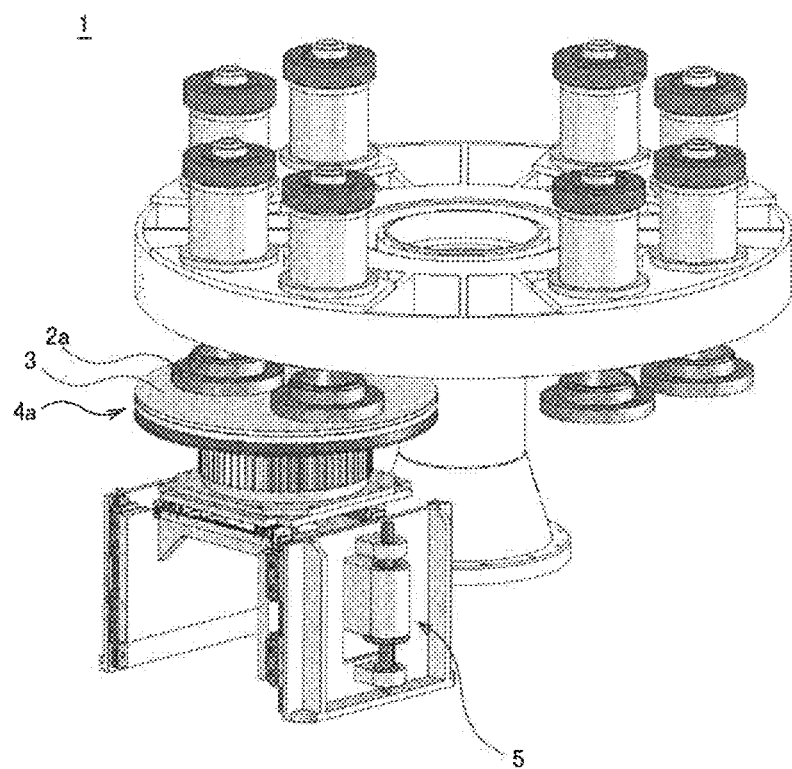
FIG. 2 is a schematic diagram illustrating an example of a turn table upward and downward movement mechanism in an example of the polishing apparatus of the present invention.

As illustrated in FIG. 2, the turn tables 4a to 4c and the turn table upward and downward movement mechanism 5 are located at a lower part of the polishing apparatus 1. In this manner, by providing the turn tables 4a to 4c and the turn table upward and downward movement mechanism 5 which are heavy goods at the lower part of the apparatus, it is possible to increase stiffness of the apparatus.

The turn table upward and downward movement mechanism 5 can be, for example, configured using a ball screw. The turn table upward and downward movement mechanism 5 can move the turn tables 4a to 4c upward and downward and stop the turn tables 4a to 4c at desired arbitrary height positions. The turn table upward and downward movement mechanism 5 is configured to be able to move the turn tables 4a to 4c upward and downward independently. For example, at the polishing apparatus 1 illustrated in FIG. 1A and FIG. 1B, three independent turn table upward and downward movement mechanisms 5 respectively corresponding to the turn tables 4a to 4c are provided. The stroke widths of the turn tables 4a to 4c can be set at, for example, 100 mm.

Figure 1A:
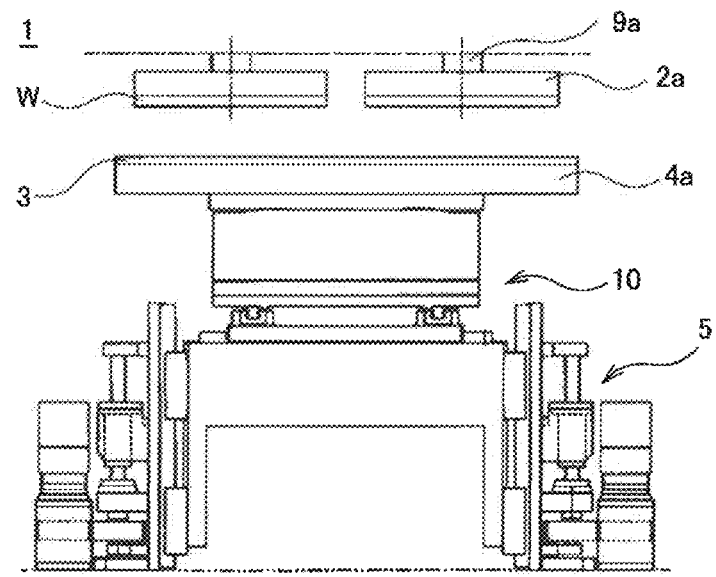
FIG. 1A is a schematic side view illustrating a state where a turn table is located at a lowermost position of upward and downward movement in an example of a polishing apparatus of the present invention.
Figure 1B:
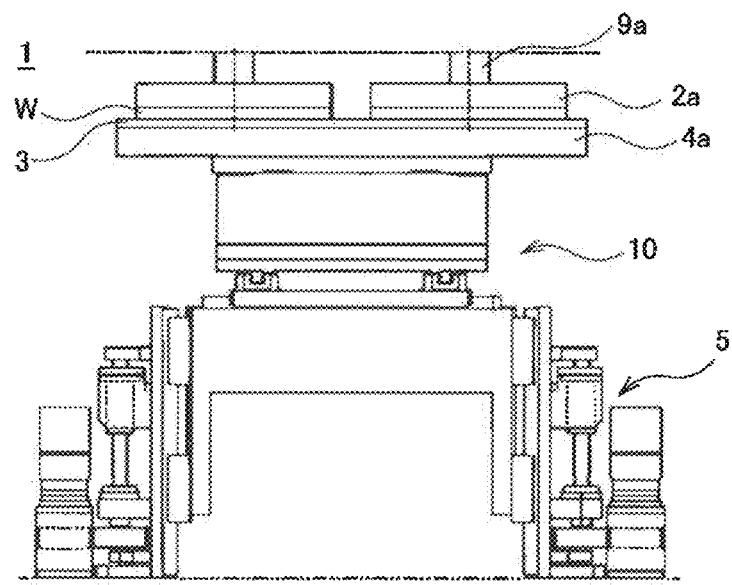
FIG. 1B is a schematic side view illustrating a state where the turn table is located at an uppermost position of the upward and downward movement in an example of the polishing apparatus of the present invention.

Note that, in FIG. 1A, FIG. 1B and FIG. 2, only a turn table, a polishing head and a polishing shaft with a suffix a are illustrated, and components with other suffixes are omitted. In FIG. 3A, FIG. 3B, FIG. 4A, FIG. 4B and FIG. 7, the polishing heads 2a to 2d are indicated with reference numeral 2. Further, in a similar manner, the turn tables 4a to 4c are indicated with reference numeral 4, and the polishing shafts 9a to 9d are indicated with reference numeral 9.

As illustrated in FIG. 1A, positions where the turn tables 4a to 4c move downward to the lowermost position of the upward and downward movement can be set at positions of the turn tables 4a to 4c when the polishing pad 3 is dressed. In this manner, when the turn tables move downward, as illustrated in FIG. 4A and FIG. 4B, it is possible to dress (or brush) the polishing pad 3 at the dressing mechanism 6.

Figure 3A:
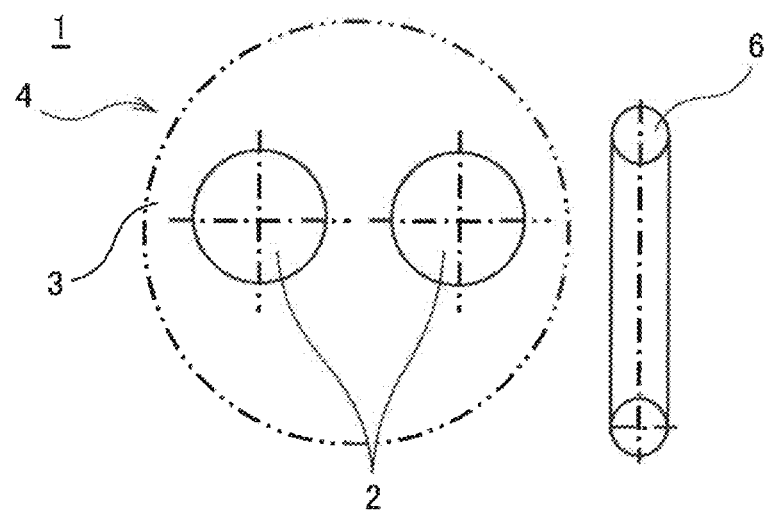
FIG. 3A is a schematic top view when a wafer is polished in a state where the turn table is moved upward with the turn table upward and downward movement mechanism in an example of the polishing apparatus of the present invention.
Figure 4A:
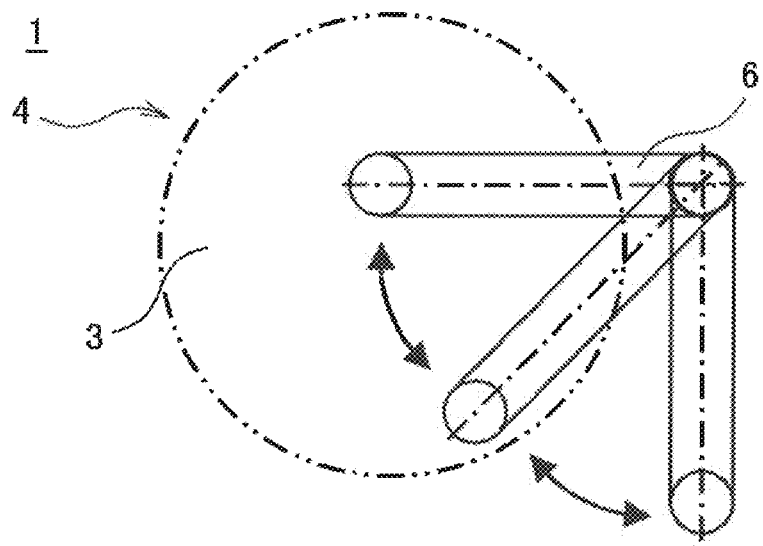
FIG. 4A is a schematic top view when a polishing pad is dressed in a state where the turn table is moved downward with the turn table upward and downward movement mechanism in an example of the polishing apparatus of the present invention.

Specifically, after the turn tables move downward to the lowermost position of the upward and downward movement, the dressing mechanism 6 moves from the initial position as illustrated in FIG. 3A to above the polishing pad 3 as illustrated in FIG. 4A and performs dressing.

As illustrated in FIG. 1B, positions where the turn tables 4a to 4c move upward to the uppermost position of the upward and downward movement can be set as positions of the turn tables 4a to 4c when the wafer W is polished.

With such a polishing apparatus, because it is not necessary to move the polishing head upward and downward with a long stroke width, it is possible to shorten the length of the polishing shaft. By this means, stiffness of the polishing shaft is increased, so that it is possible to reduce an amount of displacement of the polishing shaft caused when moment load is applied during polishing. By this means, it is possible to polish the wafer with high accuracy.

As illustrated in FIG. 4A and FIG. 4B, the dressing mechanism 6 is preferably provided at a position where the dressing mechanism 6 does not interfere with a trajectory on which the polishing head 2 performs rotation movement.

With such a configuration, it is possible to perform rotation movement of the polishing head and upward and downward movement of the turn tables in parallel without the polishing head interfering with the dressing mechanism. It is therefore possible to reduce takt time and improve productivity.

At the polishing apparatus 1, a polishing head upward and downward movement mechanism (not illustrated) for moving the polishing heads 2a to 2d upward and downward can be provided. As described above, the polishing apparatus 1 of the present invention does not have to move the polishing heads 2a to 2d with a large stroke width and only has to have a minimum required stroke width for supporting various kinds of polishing heads. 20 mm or less is enough for this stroke width, and if the stroke width is 20 mm, the polishing head can also support polishing heads with different structures, such as a contact method and a water filling method. If the upward and downward movement width is equal to or less than 20 mm, it is possible to reliably suppress degradation of stiffness of the polishing shaft, so that it is possible to more reliably reduce an amount of displacement of the polishing shaft when moment load is applied during polishing.

Further, when a polishing pad 3 with no groove is used, there is a case where the wafer W is adsorbed to the polishing pad 3, and, a phenomenon that the turn tables 4a to 4c are slightly lifted occurs when the polishing heads 2a to 2d are separated from the polishing pad 3. In this case, by respectively moving a plurality of polishing heads 2a to 2d assigned to one turn table upward with a time lag, it is possible to reduce adsorption force of the wafer W and the polishing pad 3 when the polishing heads 2a to 2d move upward. Further, because the polishing head upward and downward movement mechanism allows the polishing head to be easily changed, the polishing head upward and downward movement mechanism is also preferably provided at the polishing apparatus 1 having the turn table upward and downward movement mechanism 5.

While, in the above mention, two polishing heads are assigned to one turn table, it is also possible to employ a configuration where one polishing head is assigned to one turn table. In this case, because it is not possible to perform operation for moving the polishing heads upward with a time lag as described above, while the polishing head upward and downward movement mechanism do not have to be provided, because the polishing head upward and downward movement mechanism allows the polishing head to be easily changed, the polishing head upward and downward movement mechanism is preferably provided.

Figure 14A:
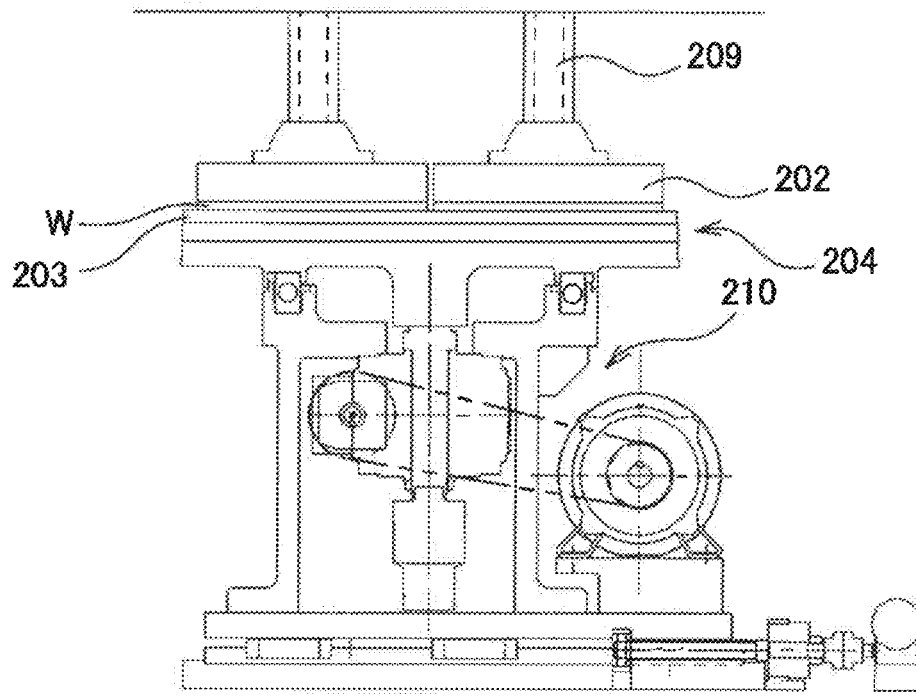
FIG. 14A is a schematic diagram illustrating a state where a polishing head is located at a lowermost position of upward and downward movement in a conventional polishing apparatus.
Figure 14B:
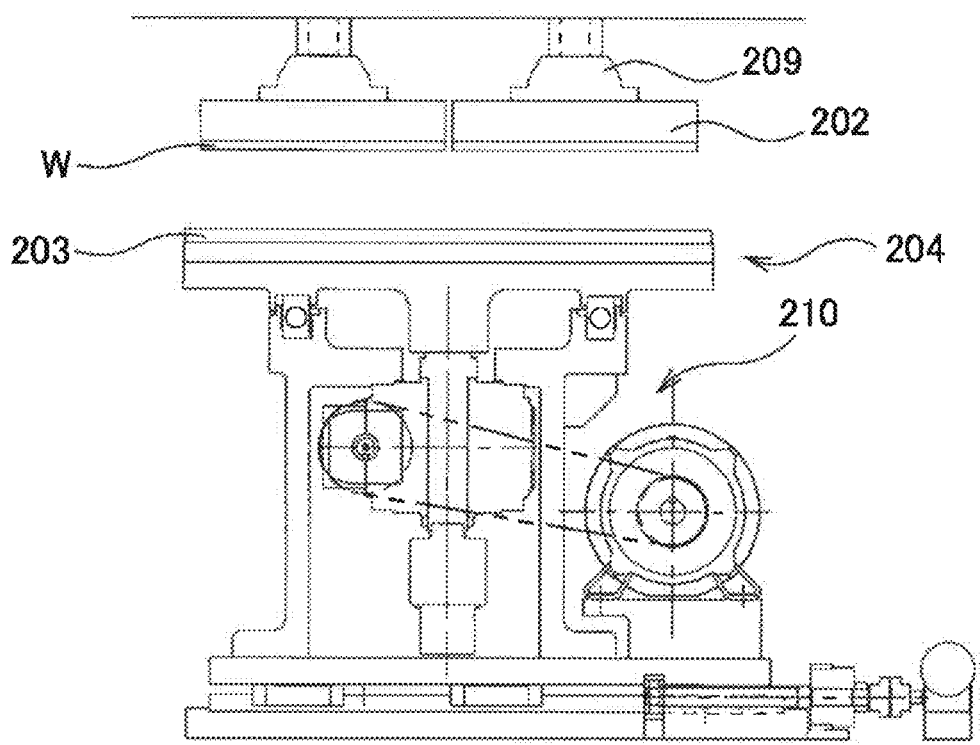
FIG. 14B is a schematic diagram illustrating a state where the polishing head is located at an uppermost position of the upward and downward movement in the conventional polishing apparatus.
Figure 15A:
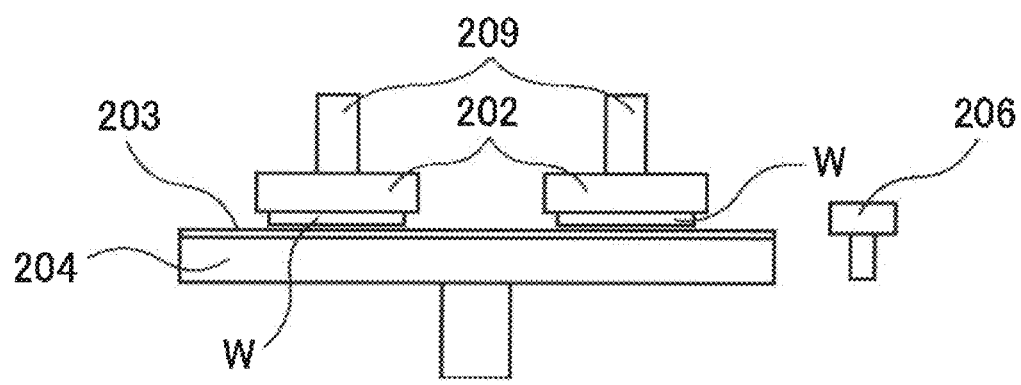
FIG. 15A is a schematic side view when the wafer is polished in a state where the polishing head is located at the lowermost position of the upward and downward movement in the conventional polishing apparatus.
Figure 15B:
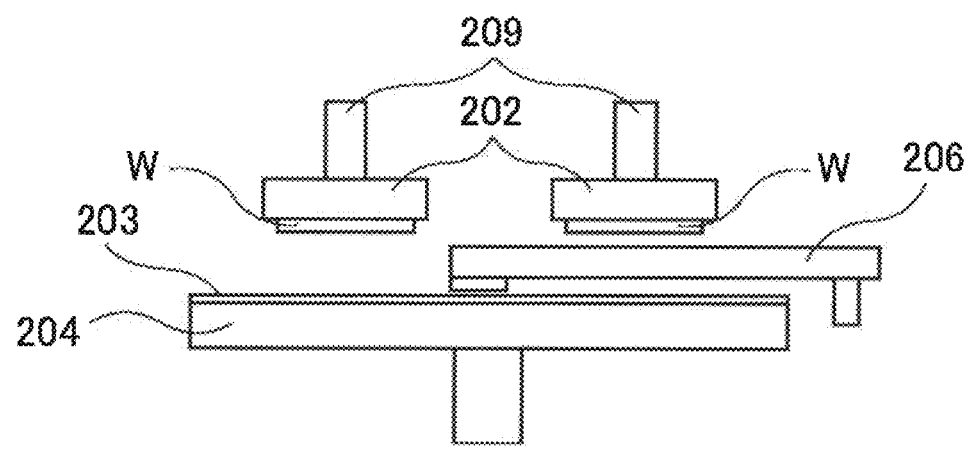
FIG. 15B is a schematic side view when a polishing pad is dressed in a state where the polishing head is located at the uppermost position of the upward and downward movement in the conventional polishing apparatus.

While the polishing heads 2a to 2d and the turn tables 4a to 4c typically employ a method in which rotation is performed with combination of a motor and a reducer 210 as illustrated in, for example, FIG. 14A and FIG. 14B, the polishing heads 2a to 2d and the turn tables 4a to 4c can be rotated using a direct drive motor. The polishing apparatus 1 illustrated in FIG. 1A and FIG. 1B use a direct drive motor 10, in which case, because ancillary facilities such as a reducer are not required, it is possible to design the turn table upward and downward movement apparatus in smaller space than in the case where a motor and a reducer are used.

The polishing apparatus 1 can preferably perform rotation movement of the polishing heads 2a to 2d and upward and downward movement of the turn tables 4a to 4c and the polishing heads 2a to 2d in parallel.

In this manner, because the both movement can be performed in parallel, it is possible to reduce takt time when the turn tables are switched or dressing is performed, so that it is possible to improve productivity.

Further, the turn table upward and downward movement mechanism 5 preferably adjusts the height of the turn tables 4a to 4c according to abrasion of the polishing pad 3 or abrasion of dressing (or brushing) when dressing of the polishing pad 3 is performed at the dressing mechanism 6. As the polishing cycle increases, an abrasion amount of the polishing pad and dressing (or brushing) increases, relative positional relationship is displaced. In the present invention, because the turn tables 4a to 4c can be stopped at arbitrary height positions with the turn table upward and downward movement mechanism 5, by adjusting the height of the turn tables 4a to 4c as described above, it is possible to obtain a certain dressing effect even without adjusting the height of the dressing mechanism 6. Further, because such adjustment can be automated, it is possible to reduce process time, so that it is possible to improve productivity.

A wafer polishing method using the polishing apparatus 1 of the present invention as described above will be described next.

Figure 6:
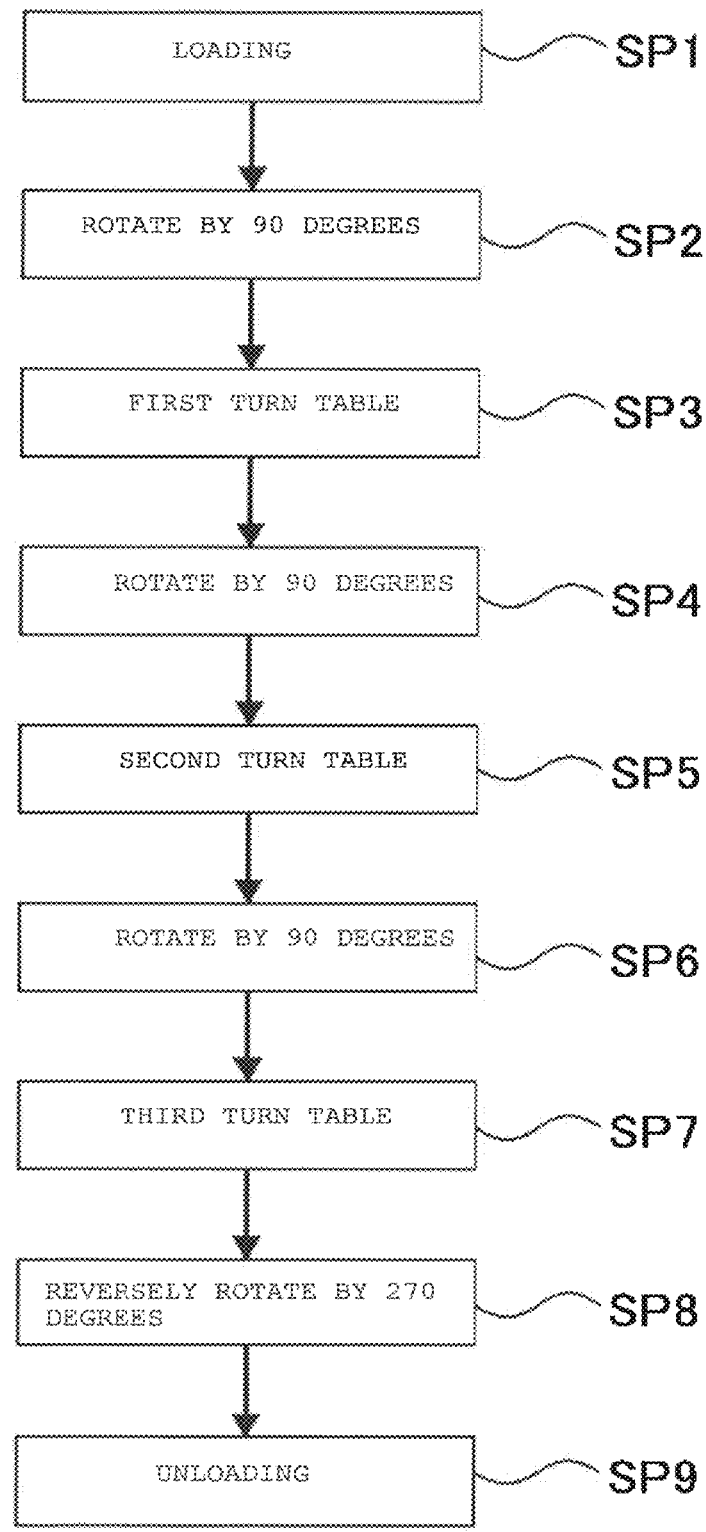
FIG. 6 is a flowchart illustrating an example of a wafer polishing method of the present invention.

Here, specific flow of the wafer polishing method will be described based on the flowchart in FIG. 6 while motion of the polishing head 2a attached to the first polishing shaft 9a illustrated in FIG. 5 is mainly described.

First, a wafer located on the loading/unloading stage 12 is loaded on the polishing head 2a and held at the polishing head 2a (SP1).

The polishing head 2a holding the wafer rotates by 90 degrees (SP2) and moves to the first turn table 4a.

Then, the first turn table 4a is moved upward to a position where the wafer contacts the polishing pad, and polishing is performed at the first turn table 4a by a polishing agent being supplied on the polishing pad from the polishing agent supplying mechanism, and a surface of the wafer being brought in sliding contact with the polishing pad while the first turn table 4a and the polishing head 2a being respectively rotated (SP3).

After polishing is finished at the first turn table 4a, the first turn table 4a is moved downward, and the polishing head 2a rotates by 90 degrees (SP4), and moves to the second turn table 4b. Then, the second turn table 4b is moved upward to a position where the wafer contacts the polishing pad, and polishing is started again (SP5).

After polishing is performed at the third turn table 4c while such operation is repeated (SP6 to SP7), the third turn table 4c is moved downward, and the first polishing head 2a is reversely rotated by 270 degrees (SP8), and returns to the loading/unloading stage 12, the wafer is unloaded from the polishing head 2a (SP9), thereby one cycle is finished.

While the wafer is loaded/unloaded at the polishing head 2a of the first polishing shaft 9a, polishing is performed in parallel at each of the first to the third turn tables 4a to 4c at the polishing heads 2b to 2d of the second to the fourth polishing shafts 9b to 9d.

According to such a wafer polishing method, because the polishing apparatus of the present invention which can reduce an amount of displacement of the polishing shaft when moment load is applied during polishing is used, it is possible to polish the wafer to obtain a wafer with favorable flatness. Further, it is possible to reduce takt time, so that it is possible to improve productivity.

Further, after polishing of the wafer is finished, if the polishing pad is dressed after the height of the turn table is adjusted according to abrasion of the polishing pad, it is possible to always obtain a certain dressing effect as that described for the polishing apparatus of the present invention, and it is possible to reduce process time.

Note that a timing at which dressing is performed is not particularly limited, and, for example, dressing may be performed every time polishing of the wafer is finished. However, because increase in a frequency of dressing leads to degradation of productivity, dressing is preferably performed at an appropriate timing according to the polishing pad or the polishing agent to be used.

EXAMPLES

While the present invention will be more specifically described with examples of the present invention and Comparative Examples, the present invention is not limited to these examples.

Example 1

The polishing apparatus of the present invention was prepared and shaft stiffness was evaluated. The prepared polishing apparatus supports polishing of a wafer having a diameter of 300 mm. The polishing head has a polishing head upward and downward movement mechanism for moving the polishing head upward and downward with a stroke width of 20 mm, and the turn table upward and downward movement mechanism has a stroke width of upward and downward movement of 100 mm.

First, influence in the case where moment load is applied on the polishing head and the polishing shaft while the wafer is polished was analyzed through simulation. Note that the simulation was performed using Solidworks simulation.

Figure 7:
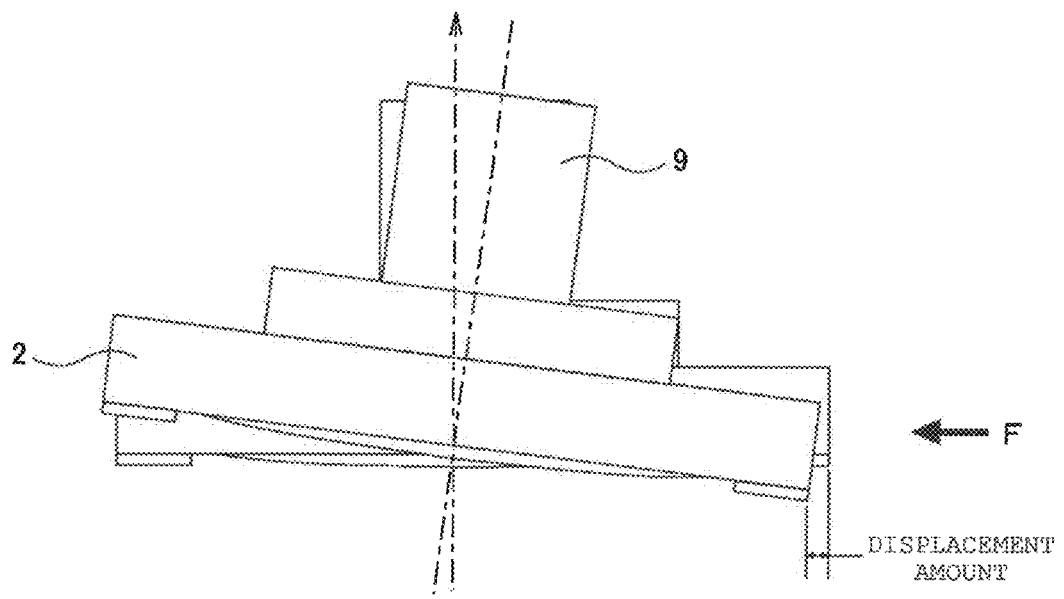
FIG. 7 is a schematic diagram illustrating a direction of moment load applied on a polishing head in simulation in Example 1.

Concerning influence of the moment load, as illustrated in FIG. 7, an amount of displacement of the polishing head 2 in a parallel direction in the case where load F is applied on the polishing head 2 was obtained.

As conditions of the simulation, it was assumed that load in a lateral direction of approximately 200 kgf was applied on the polishing head 2 upon polishing. As a result, as indicated in Table 1, the amount of displacement of the polishing head 2 in the parallel direction was 8.18 μm.

Figure 8:
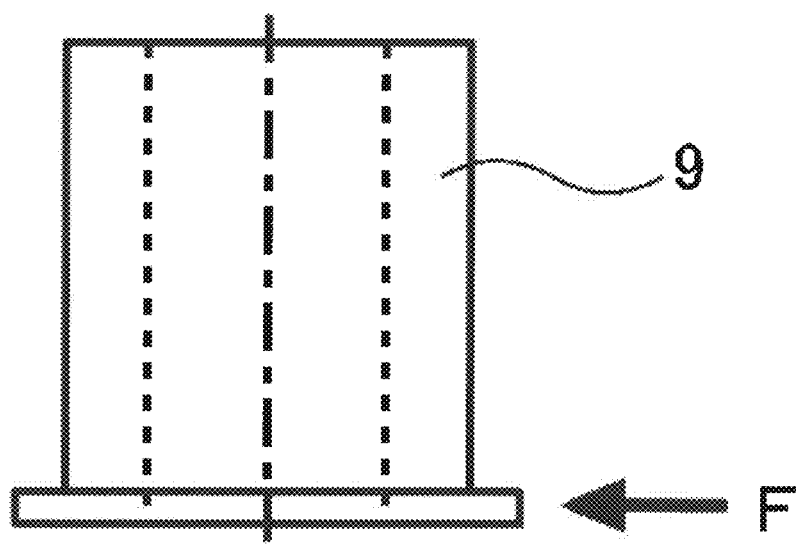
FIG. 8 is a schematic diagram illustrating a direction of load applied on a flange portion of the polishing shaft in simulation in Example 1.

Further, as the shaft stiffness, as illustrated in FIG. 8, an amount of displacement of an end face of the flange portion of the polishing shaft 9 in a direction parallel to the load F in the case where load F was directly applied on the polishing shaft 9 in a direction of an arrow (lateral direction) as illustrated in FIG. 8 was obtained.

As conditions of the simulation, it was assumed that load of approximately 15 kgf in the lateral direction was directly applied on the polishing shaft 9. As a result, the amount of displacement of the polishing shaft 9 was 0.15 μm as indicated in Table 1.

Figure 9:
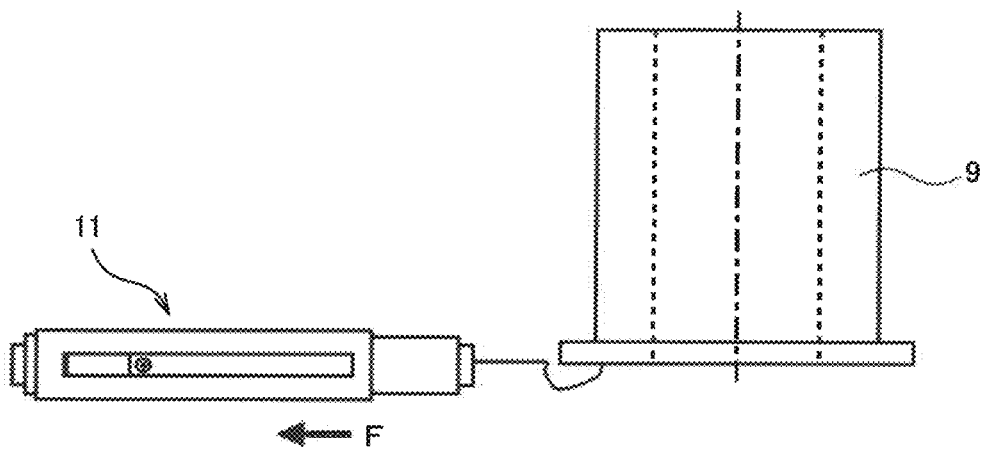
FIG. 9 is a schematic diagram illustrating a direction of load actually applied on the flange portion of the polishing shaft in Example 1.

Subsequently, as illustrated in FIG. 9, not as the simulation, load of approximately 15 kgf in the lateral direction was actually applied on the flange portion of the polishing shaft 9 using a spring scale 11, and an amount of displacement of the end face of the flange portion was measured. At this time, the amount of displacement of the end face of the flange portion was measured using a laser displacement gauge.

As a result, as indicated in Table 1, while the amount of displacement in the simulation was 0.15 μm, the actual measured amount of displacement was 0.33 μm.

TABLE 1

| | Example 1 | | |
|---|---|---|---|
| | Simulation | | Actual measurement |
| Lateral load [kgf] | 200 | 15 | 15 |
| Displacement amount [μm] | 8.18 | 0.15 | 0.33 |

Comparative Example 1

Simulation and evaluation of shaft stiffness using the spring scale 11 was performed as in Example 1 in a conventional polishing apparatus which does not have a turn table upward and downward movement mechanism of the present invention and whose stroke width of the polishing head upward and downward movement mechanism is 120 mm.

As conditions of the simulation, as in Example 1, it was assumed that load of approximately 200 kgf in the lateral direction was applied on the polishing head during polishing. As a result, the amount of displacement of the polishing head in the parallel direction was 171.90 μm as indicated in Table 2.

Further, the amount of displacement of the polishing shaft in the case where load of approximately 15 kgf in the lateral direction was applied on the polishing shaft was 3.8 m as indicated in Table 2.

Subsequently, an actual measured value of the amount of displacement of the end face of the flange portion of the polishing shaft was measured while load was applied on the polishing shaft using the spring scale 11 as in Example 1. As a result, while the amount of displacement in the simulation was 3.8 μm, as indicated in Table 2, the actual measured amount of displacement was 8.1 μm.

TABLE 2

| | Comparative Example 1 | | |
|---|---|---|---|
| | Simulation | | Actual measurement |
| Lateral load [kgf] | 200 | 15 | 15 |
| Displacement amount [μm] | 171.90 | 3.8 | 8.1 |

From the results, because, in Example 1, it was possible to reduce the stroke width of the polishing head upward and downward movement mechanism from 120 mm to 20 mm and improve stiffness of the polishing shaft by providing the turn table upward and downward movement mechanism, it was possible to considerably reduce the amount of displacement of the polishing shaft due to the moment load compared to Comparative Example 1.

Example 2

In the polishing apparatus of the present invention having the turn table upward and downward movement mechanism and the polishing head upward and downward movement mechanism, time required for the polishing head to move from the lowermost position to the uppermost position of the upward and downward movement was measured. Note that the stroke width of the polishing head upward and downward movement mechanism was set at 20 mm, and the upward and downward movement speed of the polishing head was set at 35 mm/second.

As a result, moving time was 1.1 seconds on average including time required for acceleration and deceleration.

Comparative Example 2

In the conventional polishing apparatus which does not have a turn table upward and downward movement mechanism of the present invention, time required for the polishing head to move from the lowermost position to the uppermost position of the upward and downward movement was measured. Note that the stroke width of the polishing head upward and downward movement mechanism was set at 120 mm, and the upward and downward movement speed of the polishing head was set at 35 mm/second as in Example 2.

As a result, moving time was 3.8 seconds on average including time required for acceleration and deceleration.

From the above results, in Example 2, it was possible to considerably reduce the moving time of the polishing head compared to Comparative Example 2.

Example 3

The polishing pad was dressed using the polishing apparatus having the turn table upward and downward movement mechanism and the dressing mechanism of the present invention, and change of the thickness of the polishing pad through dressing was evaluated. As the polishing pad, a hard urethane foam polishing pad for which the thickness can be easily measured was used. Further, to allow the thickness of the polishing pad to easily change, a diamond dresser having a high removal effect of a polishing pad surface layer was used, a dressing period was extended, and dressing was repeatedly performed.

Figure 10:
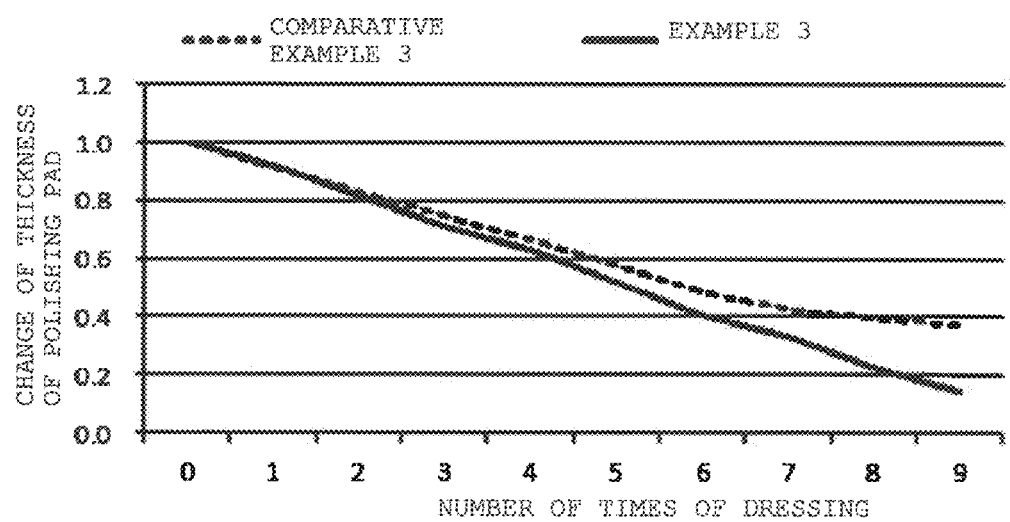
FIG. 10 is a diagram illustrating relationship between the number of times of dressing and change of a thickness of the polishing pad in Example 3 and Comparative Example 3.
Figure 11:
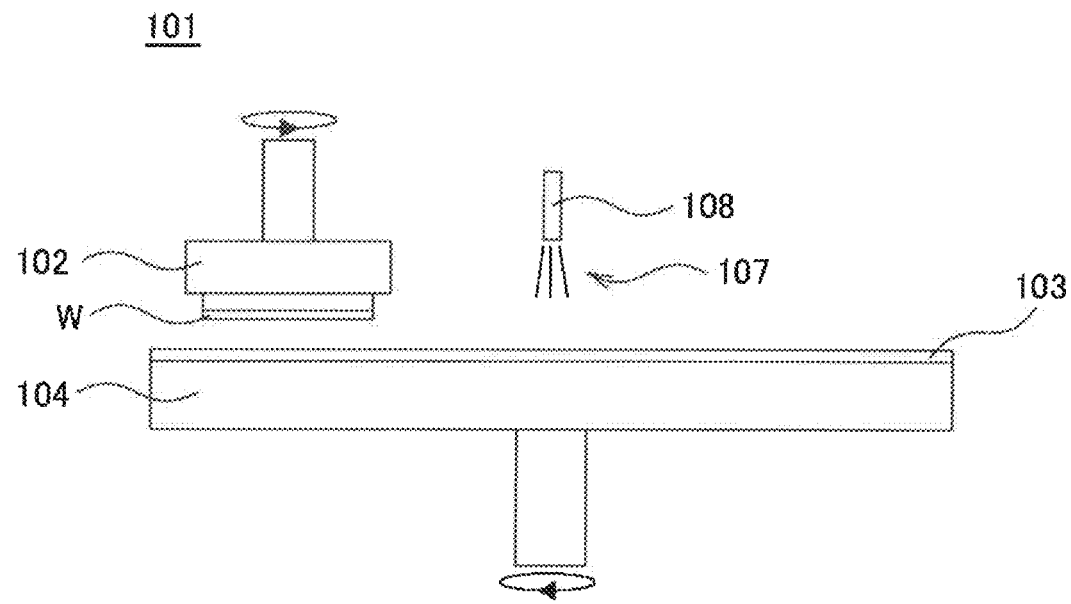
FIG. 11 is a schematic diagram illustrating an example of a typical one-side polishing apparatus.
Figure 12:
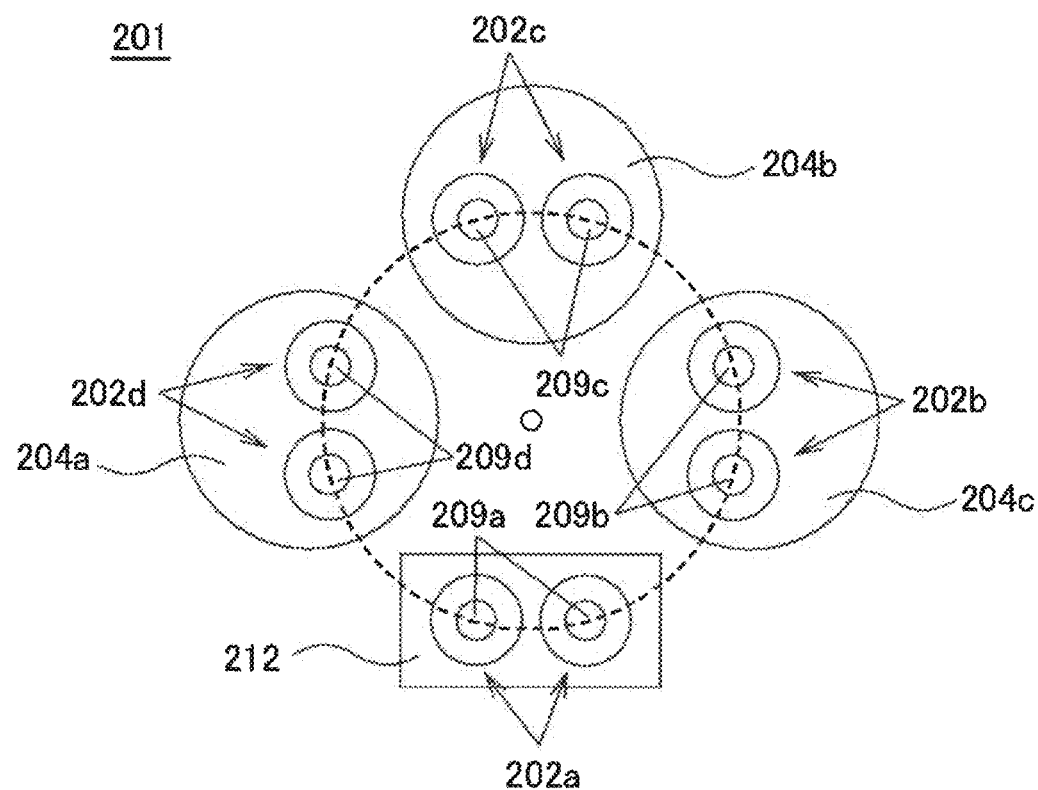
FIG. 12 is a schematic diagram illustrating an example of a typical index system wafer polishing apparatus.
Figure 13:
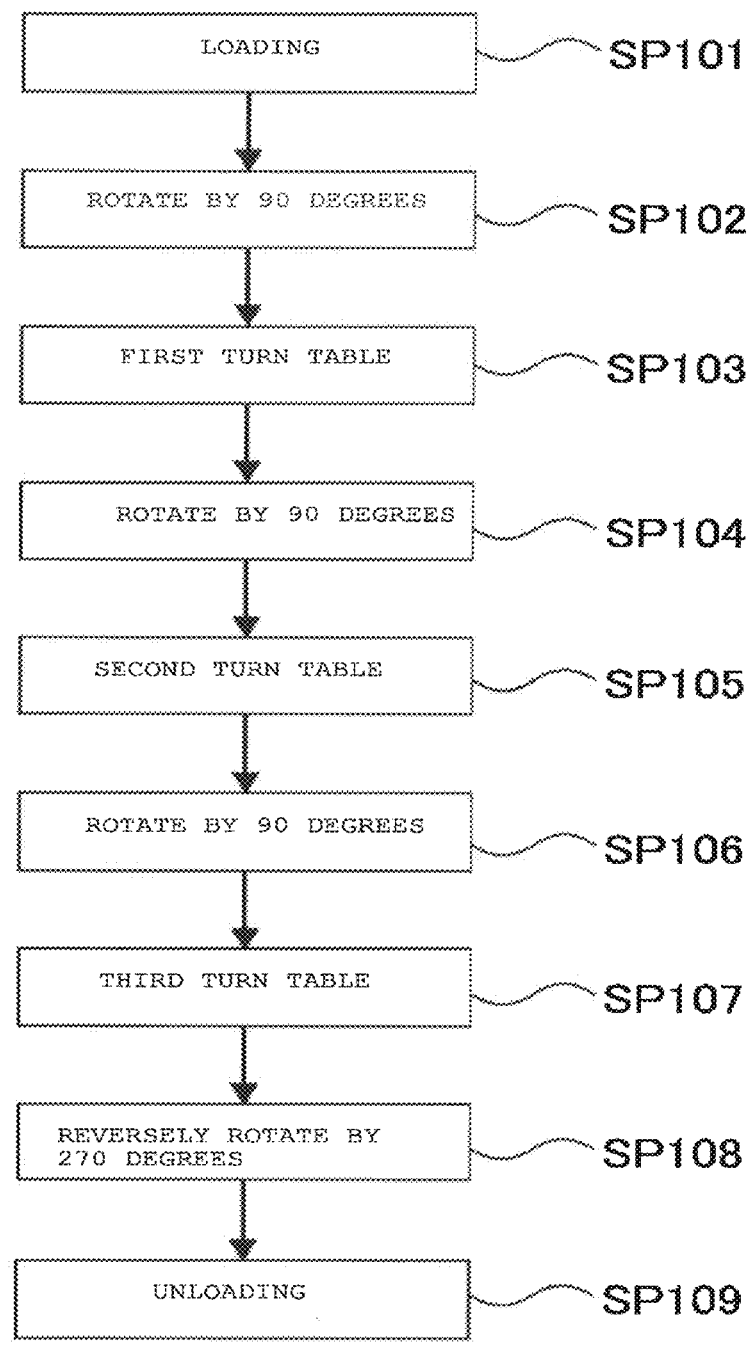
FIG. 13 is a flowchart illustrating an example of a typical index system wafer polishing method.

Then, before each dressing was started, the height of the turn table was adjusted according to abrasion of the polishing pad. Specifically, an amount of displacement of the polishing pad due to dressing was obtained from the thickness of the polishing pad before and after the dressing, and dressing was repeatedly performed while increasing the height of the turn table by an amount corresponding to the amount of displacement. The measurement result at this time is illustrated in FIG. 10. FIG. 10 illustrates change of the thickness through repetition of the dressing when the thickness of the polishing pad before the first dressing is set at 1.0. The thickness of the polishing pad was measured by measuring a cutout portion for thickness measurement provided at an outer peripheral portion of the polishing pad using a laser displacement gauge.

As illustrated in FIG. 10, it was confirmed that a change rate of the thickness of the polishing pad was substantially constant, and a certain dressing effect was maintained regardless of the thickness of the polishing pad.

Comparative Example 3

Change of the thickness of the polishing pad through dressing was evaluated using the conventional polishing apparatus which does not have the turn table upward and downward movement mechanism of the present invention and whose height position of the turn table is fixed, as in Example 3, except that the height of the dressing mechanism was not adjusted. Note that the same polishing pad and dresser were used as those used in Example 3.

As a result, as illustrated in FIG. 10, a change rate of the thickness of the polishing pad degrades as the dressing was repeated. This indicates that the dressing effect degrades.

Example 4

Polishing of a silicon wafer of 300 mm and dressing of the polishing pad were actually performed using the polishing apparatus having the turn table upward and downward movement mechanism and the dressing mechanism of the present invention. The polishing head was made to perform rotation movement at the same time as picking up of the wafer during a polishing cycle.

As a result, compared to the comparison result, it is possible to reduce cycle time by 3 seconds on average.

Further, when the height of the turn table upon dressing was made to be automatically set by the turn table upward and downward movement mechanism according to abrasion of the brush and the polishing pad, it becomes not necessary to stop the polishing apparatus to adjust the height of the dressing mechanism, which leads to improvement in productivity by 5% in Example 4 compared to in Comparative Example 4 as well as reduction in cycle time as described above.

Comparative Example 4

Polishing of a silicon wafer of 300 mm and dressing of the polishing pad were actually performed using the conventional polishing apparatus which does not have a turn table upward and downward movement mechanism of the present invention.

Because the conventional polishing apparatus cannot perform rotation movement at the same time as picking up of the wafer, cycle time was longer by 3 seconds on average than that in Example 3.

Further, because, with the conventional polishing apparatus, it is necessary to stop the polishing apparatus to adjust the height of the dressing mechanism according to abrasion of the brush and the polishing pad, productivity was lower by 5% as well as the cycle time was longer than that in Example 4.

Note that the present invention is not limited to the embodiment. The embodiment is an example, and any embodiment which has substantially the same configuration as technical concept recited in claims of the present invention and which provides similar operational effects is incorporated in the technical scope of the present invention.

The invention claimed is:

1. An index system polishing apparatus comprising:
    a polishing head that holds a wafer;
    a plurality of turn tables to which polishing pads that polish the wafer are attached; and
    a loading/unloading stage that loads the wafer to the polishing head or unloads the wafer from the polishing head, and which polishes the wafer while switching the turn tables to be used for polishing the wafer held at the polishing head by causing the polishing head to perform rotation movement;
    a turn table upward and downward movement mechanism that allows the turn tables to move upward and downward; and
    a polishing head upward and downward movement mechanism that causes the polishing head to move upward and downward with a stroke width of 20 mm or less,
    wherein rotation movement of the polishing head and upward and downward movement of the turn tables and the polishing head are performed in parallel.

2. The polishing apparatus according to claim 1, wherein the polishing apparatus has a dressing mechanism at a position where the dressing mechanism does not interfere with a trajectory on which the polishing head performs rotation movement.

3. The polishing apparatus according to claim 2, wherein the turn table upward and downward movement mechanism adjusts height of the turn tables according to abrasion of the polishing pads when dressing of the polishing pads is performed by the dressing mechanism.

4. A wafer polishing method comprising providing the polishing apparatus according to claim 3, wherein switching of the turn tables to be used for polishing the wafer held at the polishing head is performed by the turn tables being moved downward and the polishing head being made to perform the rotation movement.

5. A wafer polishing method comprising providing the polishing apparatus according to claim 3, wherein switching of the turn tables to be used for polishing the wafer held at the polishing head is performed by the turn tables being moved downward and the polishing head being made to perform the rotation movement, and
   the method further comprises adjusting height of the turn tables according to abrasion of the polishing pads and dressing the polishing pads after polishing of the wafer is finished.

6. A wafer polishing method comprising providing the polishing apparatus according to claim 2, wherein switching of the turn tables to be used for polishing the wafer held at the polishing head is performed by the turn tables being moved downward and the polishing head being made to perform the rotation movement.

7. A wafer polishing method comprising providing the polishing apparatus according to claim 2, wherein switching of the turn tables to be used for polishing the wafer held at the polishing head is performed by the turn tables being moved downward and the polishing head being made to perform the rotation movement, and
   the method further comprises adjusting height of the turn tables according to abrasion of the polishing pads and dressing the polishing pads after polishing of the wafer is finished.

8. A wafer polishing method comprising providing the polishing apparatus according to claim 1, wherein switching of the turn tables to be used for polishing the wafer held at the polishing head is performed by the turn tables being moved downward and the polishing head being made to perform the rotation movement.

* * * * *